United States Patent
Yu et al.

(10) Patent No.: US 9,010,617 B2
(45) Date of Patent: Apr. 21, 2015

(54) SOLDER JOINT REFLOW PROCESS FOR REDUCING PACKAGING FAILURE RATE

(75) Inventors: Chen-Hua Yu, Hsin-Chu (TW); Wen-Yao Chang, Hsin-Chu (TW); Chien Rhone Wang, Hsin-Chu (TW); Kewei Zuo, Yonghe (TW); Chung-Shi Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 67 days.

(21) Appl. No.: 12/987,702

(22) Filed: Jan. 10, 2011

(65) Prior Publication Data
US 2012/0175403 A1    Jul. 12, 2012

(51) Int. Cl.
  *B23K 31/02*  (2006.01)
  *H01L 21/44*  (2006.01)
  *H01L 23/00*  (2006.01)

(52) U.S. Cl.
  CPC ....... *H01L 24/81* (2013.01); *H01L 2224/16225* (2013.01); *H01L 2924/01082* (2013.01); *H01L 2924/01006* (2013.01); *H01L 2924/01019* (2013.01); *H01L 2924/01033* (2013.01); *H01L 2924/01047* (2013.01); *H01L 2924/0105* (2013.01); *H01L 2924/01322* (2013.01); *H01L 2924/014* (2013.01); *H01L 2924/14* (2013.01); *H01L 2224/75501* (2013.01); *H01L 2224/75502* (2013.01); *H01L 24/13* (2013.01); *H01L 24/75* (2013.01); *H01L 2224/13111* (2013.01); *H01L 2224/16145* (2013.01); *H01L 2224/7525* (2013.01); *H01L 2224/75251* (2013.01); *H01L 2224/75252* (2013.01); *H01L 2224/75283* (2013.01); *H01L 2224/81055* (2013.01); *H01L 2224/81097* (2013.01); *H01L 2224/8121* (2013.01); *H01L 2224/8123* (2013.01); *H01L 2224/81805* (2013.01); *H01L 2224/8181* (2013.01); *H01L 2224/81815* (2013.01); *H01L 2224/81098* (2013.01)

(58) Field of Classification Search
  USPC ............................. 228/180.22, 200; 420/501
  See application file for complete search history.

(56) References Cited

U.S. PATENT DOCUMENTS

| 6,204,490 B1 * | 3/2001 | Soga et al. | 219/678 |
| 6,610,559 B2 * | 8/2003 | Wang et al. | 438/108 |
| 2003/0156969 A1 * | 8/2003 | Choi et al. | 420/560 |

FOREIGN PATENT DOCUMENTS

CN    101127314    2/2008

OTHER PUBLICATIONS

Karakaya et al., "Bulletin of Alloy Phase Diagrams", vol. 8, No. 4, 1987, p. 326-333.*
Garcia et al., "The effect of cooling rate on the dendritic spacing and morphology of Ag3Sn intermetallic particles of SnAg solder alloy", Materials and Design, 2011, vol. 32, available online Dec. 28, 2010, p. 3008-3012.*

* cited by examiner

Primary Examiner — Devang R Patel
(74) Attorney, Agent, or Firm — Slater & Matsil, L.L.P.

(57) ABSTRACT

In a reflow process, a plurality of solder bumps between a first workpiece and a second workpiece is melted. During a solidification stage of the plurality of solder bumps, the plurality of solder bumps is cooled at a first cooling rate. After the solidification stage is finished, the plurality of solder bumps is cooled at a second cooling rate lower than the first cooling rate.

9 Claims, 5 Drawing Sheets

SOLDER JOINT REFLOW PROCESS FOR REDUCING PACKAGING FAILURE RATE

BACKGROUND

Solder bumps are widely used in the bonding of integrated circuit components. To bond the integrated circuit components, solder bumps are placed between and contacting bond pads of the integrated circuit components. A reflow is then performed to melt the solder bumps. The reflow may be performed by heating the integrated circuit components, for example, using an infrared heater, to a temperature higher than the melting temperature of solder bumps. The solder bumps are then solidified. The reflow of solder bumps are often used in flip-chip bonding.

Solder bumps are often subject to cracking due to thermal cycles. The cracking of solder bumps results in the performance and the reliability of integrated circuits to be degraded. Furthermore, the reflow processes may cause delamination between different layers in the integrated circuit components, particularly between low-k or extreme low-k dielectric layers.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of performing reflow processes in the bonding of integrated circuit components is provided in accordance with an embodiment. The variations of the embodiment are discussed. Throughout the various views and illustrative embodiments, like reference numbers are used to designate like elements.

Figure 1:
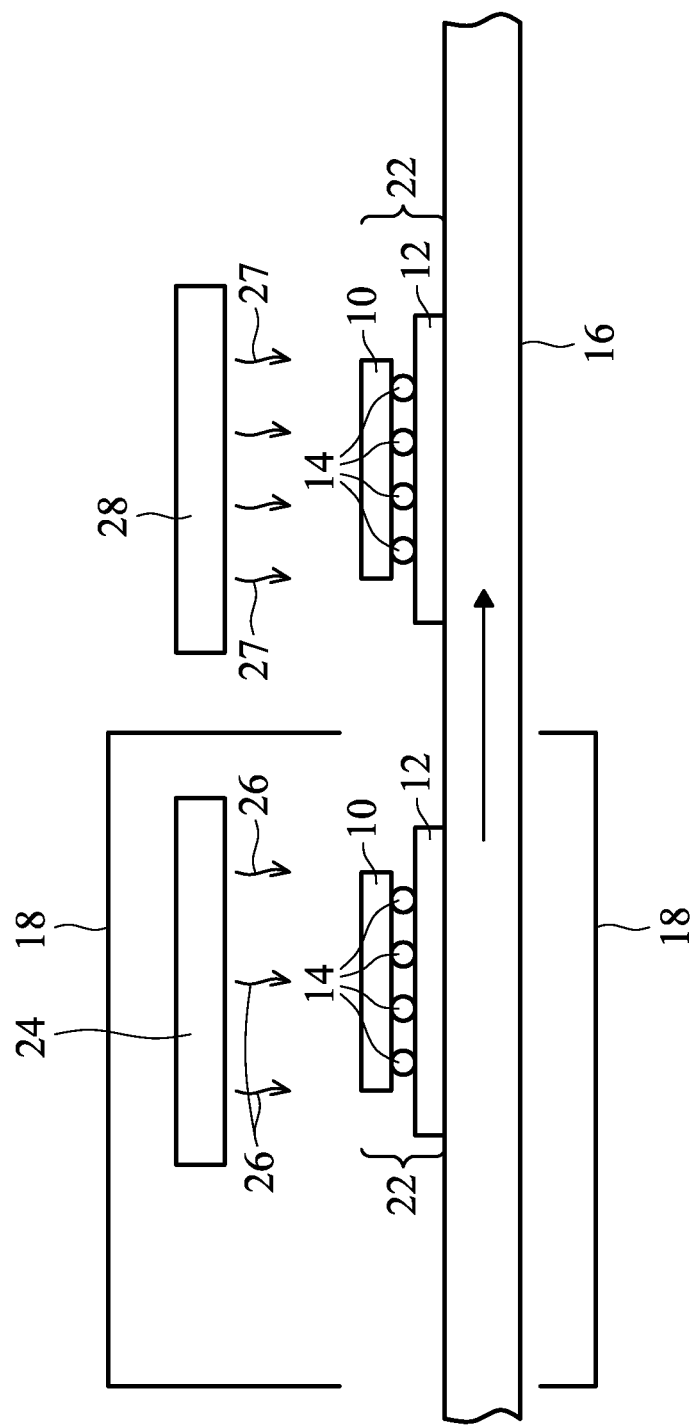
FIGS. 1 and 2 illustrate cross-sectional views of exemplary reflow processes.
Figure 2:
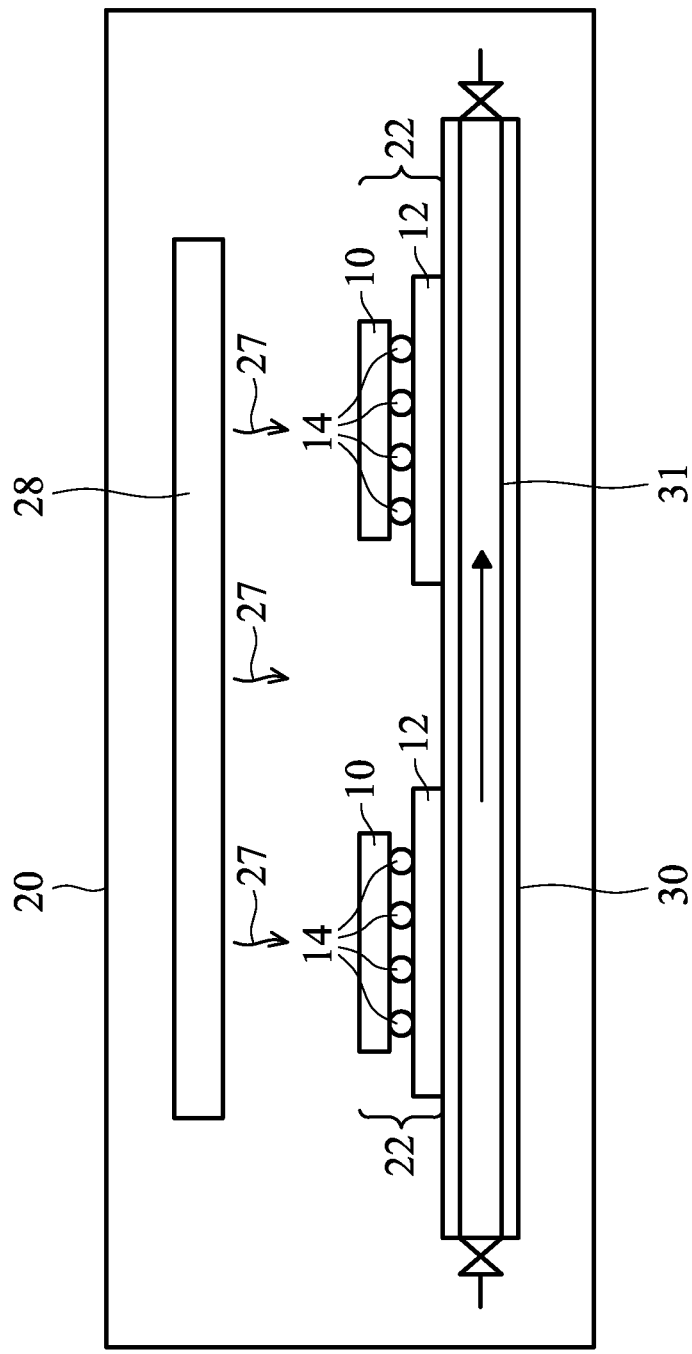

FIGS. 1 and 2 illustrate cross-sectional views of reflow processes in accordance with embodiments. Work pieces 10 and 12 are to be bonded, for example, through flip-chip bonding. Throughout the description, work pieces 10 may be referred to as device dies, and work pieces 12 may be referred to as package substrates. However, in alternative embodiments, each of work pieces 10 and 12 may be a device die including integrated circuits devices such as transistors therein, a package substrate, an interposer, a printed circuit board (PCB), or the like. Solder bumps 14 are disposed between work pieces 10 and 12. Work pieces 10 and 12 and solder bumps 14 in combination are referred to as package structures 22 hereinafter.

FIG. 1 illustrates a convection-type reflow process in accordance with an embodiment, in which work pieces 10 and 12 are transferred by conveyor belt 16. Conveyor belt 16 may transfer package structure 22 into and out of convection reflow oven 18, for example. When package structure 22 is transferred into oven 18, solder bumps 14, which join work pieces 10 to respective underlying work pieces 12, are heated to a temperature higher than the melting temperature of solder bumps 14. In an embodiment, the heating is performed by using one or more heating sources 24, which may be disposed over and/or under work pieces 10 and 12. Heating source 24 may be a radiation-type heating source such as an infrared radiant source, or may be configured to blow hot air to work pieces 10 and 12. Arrows 26 symbolize radiated heat, hot air, or the like. It is realized that heating source 24 may also be located under work pieces 10 and 12, and may be in the form of a radiation type heating source or may blow hot air. In alternative embodiments, heating source 24 may be in any other applicable locations other than directly over or directly under work pieces 10 and 12.

FIG. 2 illustrates a batch-type reflow process in accordance with an alternative embodiment. Work pieces 10 and 12 may be placed in chamber 20, with each of work pieces 10 forming one of package structures 22 with one of work pieces 12 through solder bumps 14. The plurality of package structures 22 may be heated at the same time, and may be cooled at the same time in the subsequent cooling process. Again, the heating may be performed by using one or more heating sources (not shown), which may be disposed over or under work pieces 10 and 12. The heating source may also be a radiation type heating source (not shown) such as an infrared radiant source, or may blow hot air to work pieces 10 and 12. The heating source may also be located under work pieces 10 and 12, and may be in the form of a radiation type heating source or may blow hot air. In alternative embodiments, the heating source may be in any other applicable locations other than directly over or directly under work pieces 10 and 12.

During the reflow processes, such as the convection-type reflow processes as shown in FIG. 1 or the batch-type reflow processes as shown in FIG. 2, the temperature profile of solder bumps 14 include a heating stage and a cooling stage. The cooling stage is performed after the heating stage. Referring to FIG. 1, the cooling stage may be started after package structure is transferred out of oven 18, wherein cooling source 28 may be used to control the cooling rate of solder bumps 14. In the embodiment shown in FIG. 2, the cooling stage may be performed in chamber 20, which may be the same or different chamber as what is used to perform the heating stage, wherein cooling source 28 is used to control the cooling rate.

Figure 3:
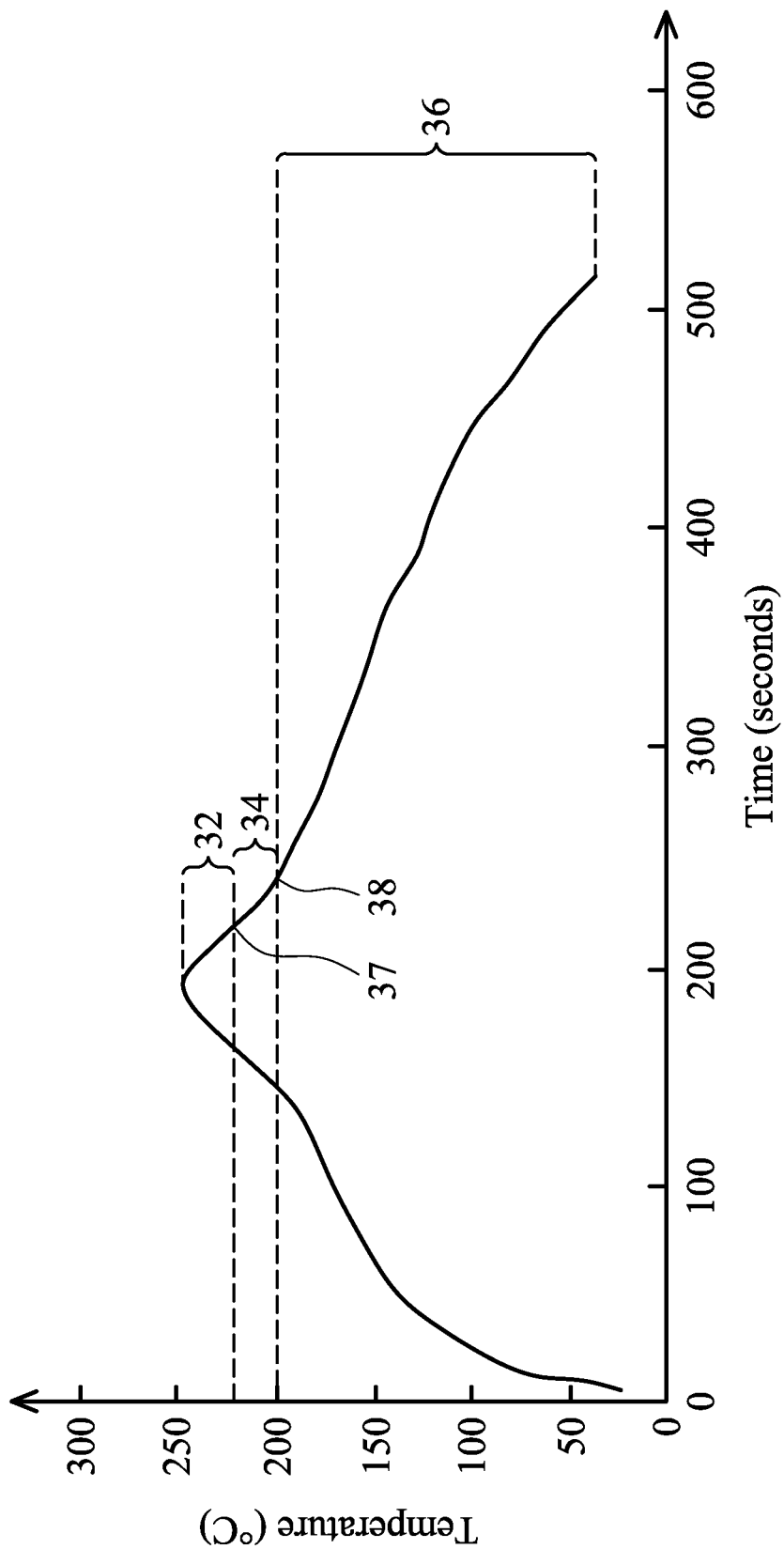
FIG. 3 illustrates an exemplary temperature profile of solder bumps in accordance with an embodiment.

FIG. 3 illustrates an exemplary temperature profile of solder bumps 14 in accordance with an embodiment. The X-axis represents the time of the reflow process, and the Y-axis represents the temperature of solder bumps 14 (please refer to FIGS. 1 and 2). The cooling stage further includes melted stage 32, solidification stage 34, and slow-cooling stage 36 for further lowering the temperature of the respective solder bumps 14.

In melted stage 32, all of solder bumps 14 attached to the same workpiece 10 and the same workpiece 12 are in the melted state. When the temperatures of solder bumps 14 are further reduced, the temperature profile goes into solidification stage 34, at which time solder bumps 14 start to solidify. The solidification may not be uniform for all of solder bumps 14 even if they are attached to the same work pieces 10 and 12. The starting point 37 of solidification stage 34 represents the time point the first one of solder bumps 14 starts to solidify. The ending point 38 of solidification stage 34 represents the time point all of solder bumps 14 attached to the same workpieces 10/12 have just finished solidification. The corresponding temperature range of solidification stage 34 is affected by the materials and the compositions of solder bumps 14. For example, for eutectic bumps 14 comprising 63 percent Ag and 37 percent Pb, the corresponding solidification stage 34 occurs in the temperature range between about 180° C. and about 150° C. In another exemplary embodiment, for lead-free bumps 14 comprising 1.8 percent Ag and 98.2 percent Sn, the solidification stage 34 may occur in the temperature range between about 225° C. and about 195° C., or in the temperature range between about 220° C. and about 200° C. The temperature range of solidification stage 34 may also be affected by the materials in workpieces 10 and 12, which materials form inter-metallic compound (IMC, not shown) with solder bumps 14. The actual temperature range of solidification stage 34 may be measured through experiments.

In an embodiment, during solidification stage 34, solder bumps 14 are cooled at a first cooling rate greater than about 1.5° C./second, which may be between about 1.8° C./second and about 2.4° C./second. As is illustrated in detail in FIGS. 4 and 5, a fast cooling in solidification stage 34 is beneficial for reducing the range (the solidification time difference) of solidification stage 34, so that the solidification of solder bumps 14 may occur in a more synched manner. As a result, the fast cooling is beneficial for reducing defect solder bumps (known as white bumps) in solder bumps 14. In an embodiment, during an entirety of solidification stage 34, the first cooling rate is kept at greater than 1.5° C./second, greater than about 1.8° C./second, and/or between 1.8° C./second and about 2.4° C./second. On the other hand, during melted stage 32, the respective cooling rate may be greater than about 1.5° C./second, between about 1.8° C./second and about 2.4° C./second, or in other ranges such as lower than 1.5° C./second.

After solidification stage 34, at which time all of solder bumps 14 have solidified, the temperature profile of solder bumps 14 enters into slow-cooling stage 36, at which time the cooling rate of solder bumps 14 is reduced to a second cooling rate lower than the first cooling rate in solidification stage 34. The second cooling rate may be lower than the first cooling rate by a difference greater than about 0.5° C., or greater than about 0.8° C. In an embodiment, the second cooling rate is lower than about 1.0° C./second, and may be lower than about 0.8° C. Slow-cooling stage 36 may be started substantially immediately after all of solder bumps 14 solidify. For example, assuming all of solder bumps 14 solidify at a first temperature, and slow-cooling stage 36 starts at a second temperature, a difference between the first temperature and the second temperature may be less than about 10° C., less than about 5° C., or less than about 2° C. In an embodiment, during substantially an entire period between the time point solidification stage 34 is finished and the time point the entire reflow process is finished, the second cooling rate is lower than about 1.0° C., and may be lower than about 0.8° C. Slow-cooling stage 36 may be finished at a temperature lower than about 100° C., at which time the entire reflow process is also finished. The slow cooling during slow-cooling stage 36 is beneficial for reducing stresses induced by the mismatch between the coefficients of thermal expansion (CTE) of different layers in workpieces 10 and 12. As a result, the delamination between different layers, particularly between different low-k dielectric layers in work pieces 10 and 12, may be reduced.

Figure 4:
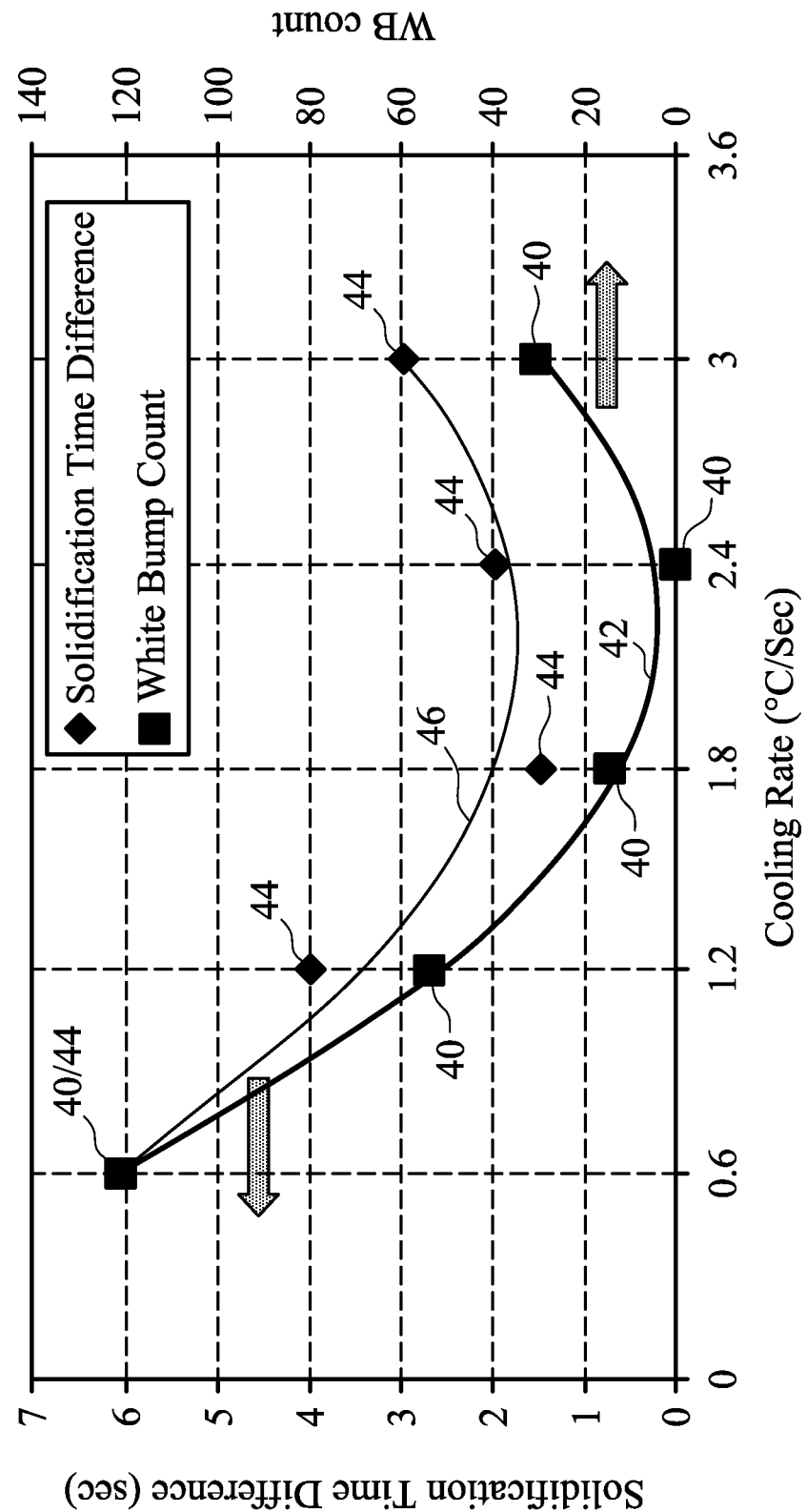
FIG. 4 illustrates solidification time differences and white bump counts as functions of cooling rates.

FIG. 4 illustrates experiment results, wherein the solidification time difference (the left Y-axis) and white bump (WB) count (the right Y-axis) are illustrated as functions of (the second) cooling rates in solidification stage 34. The solidification time difference represents the time difference between time point 37 at which solidification stage 34 (FIG. 3) starts and time point 38 at which solidification stage 34 is finished. The Experiments were performed using lead-free solder bumps, with multiple reflow processes performed on multiple package structures using different cooling rates. Diamonds 44 represent the solidification time difference, with each diamond 44 represents the result of one reflow process performed on one package structure. Line 46 is the fit line of diamonds 44. It is observed that when the cooling rates increase from about 0.6° C./second to about 2.4° C./second, the respective solidification time differences decrease. The solidification time differences reduce to the lowest point when the cooling rate reaches about 2.4° C./second. When the cooling rates further increase, the solidification time differences further increase. It is realized that when the cooling rate is further increased to greater than 2.4° C./second, stresses in workpieces 10 and 12 may adversely increase due to the CTE mismatches. Accordingly, from these experiment results, the optimum cooling rate of solidification stage 34 (FIG. 3) may be selected as greater than about 1.5° C./second, and may be between about 1.8° C./second and about 2.4° C./second.

Solid squares 40 represent the white bump (WB) counts, wherein line 42 is the fit line of solid squares 40. It is observed that the white bump counts demonstrated the similar trend as that of solidification time differences. This indicates that the reliability of the resulting package structure may be improved by adjusting the cooling rate of the solidification stage 34, wherein the cooling rate may also be adjusted to greater than about 1.5° C./second, and may be between about 1.8° C./second and about 2.4° C./second.

Referring back to FIGS. 1 and 2, the adjustment of cooling rates may be achieved, for example, by using cooling source 28 (FIG. 1) to blow air 27 onto workpieces 10 and 12 during solidification stage 34 and slow-cooling stage 36, wherein the temperatures of air 27 is adjusted. Alternatively and in addition, for the batch-type reflow processes as shown in FIG. 2, workpieces 10 and 12 may be placed on platform 30, which includes pipe 31 therein. Water at appropriate temperatures may be conducted through pipe 31, so that the cooling rates in melted stage 32, solidification stage 34, and slow-cooling stage 36 may be adjusted to desirable values.

Figure 5:
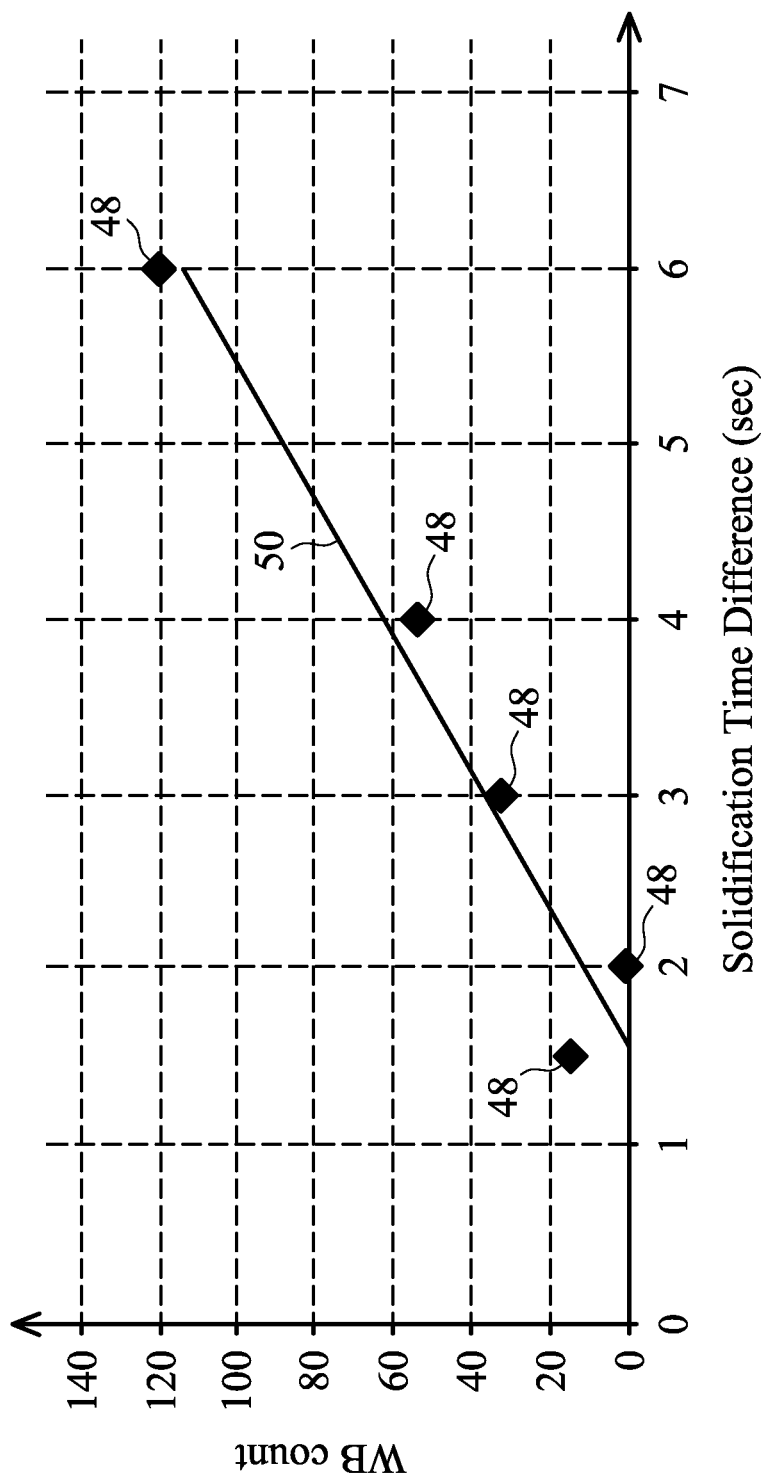
FIG. 5 illustrates white bump counts as a function of solidification time differences.

FIG. 5 illustrates the solidification time differences as a function of WB counts, wherein the solidification time differences and the WB counts of points 48 correspond to what are shown in FIG. 4. As shown by fit line 50, the WB count (which reflects the reliability of package structure 22 as shown in FIGS. 1 and 2) is substantially linear to the solidification time difference. This indicates that the solidification time differences have a strong correlation with the number of white bumps, and with the reliability of the package structure. Accordingly, reducing the solidification time differences by reducing the range of solidification stage 34 (FIG. 3) and by increasing the cooling rate in solidification stage 34 can improve the reliability of the resulting package structures.

Furthermore, it is observed that in FIG. 5, fit line 50 intercepts the X-axis when solidification time difference is at about 1.5 seconds. In experimental results including what is shown in, it was observed that 1.5 seconds of solidification time difference correspond to the cooling rate of about 1.8° C./second and about 2.4° C./second. Accordingly, the cooling rates may be determined as being between about 1.8° C./second and about 2.4° C./second in some embodiments.

It is appreciated that FIGS. 4 and 5 are experiment results obtained from lead-free solder bumps. If different materials are used to form solder bumps, the results as shown in FIGS.

4 and 5 may be different, and the results may be used to guide the selection of appropriate cooling rates in the respective solidification stages.

In accordance with embodiments, in a reflow process, a plurality of solder bumps between a first workpiece and a second workpiece is melted. During a solidification stage of the plurality of solder bumps, the plurality of solder bumps is cooled at a first cooling rate. After the solidification stage is finished, the plurality of solder bumps is cooled at a second cooling rate lower than the first cooling rate.

In accordance with other embodiments, a method includes heating a plurality of solder bumps between a first workpiece and a second workpiece to a melted state; and cooling the plurality of solder bumps. Before all of the plurality of solder bumps between the first and the second workpieces solidify, the plurality of solder bumps is cooled at a cooling rate higher than about 1.5° C./seconds.

In accordance with yet other embodiments, a method includes heating a plurality of solder bumps between a first workpiece and a second workpiece to a melted state; during a solidification stage of the plurality of solder bumps, cooling the plurality of solder bumps at a first cooling rate greater than about 1.5° C./second; and substantially immediately after the solidification stage is finished, adjusting a cooling rate of the plurality of solder bumps to a second cooling rate lower than about 1.0° C./second.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
heating a plurality of solder bumps consisting essentially of silver (Ag) and tin (Sn) between a first workpiece and a second workpiece to a melted state;
during a period of time all of the plurality of solder bumps are molten, cooling the plurality of solder bumps at a first cooling rate;
between a first time point a first one of the plurality of solder bumps starts to solidify and a second time point all of the plurality of solder bumps finish solidification, cooling the plurality of solder bumps at a second cooling rate, wherein the second cooling rate occurs within a temperature range between 200° C. and 220° C.; and
after the step of cooling the plurality of solder bumps at the second cooling rate, adjusting a cooling rate of the plurality of solder bumps to a third cooling rate lower than the second cooling rate, wherein the third cooling rate takes effect after the plurality of solder bumps reaches a temperature lower than 200° C., and wherein the third cooling rate is lower than the second cooling rate by a difference greater than about 0.5° C./second.

2. The method of claim 1, wherein at the second time point, the plurality of solder bumps is at a first temperature, and the step of cooling the plurality of solder bumps at the third cooling rate is started at a second temperature, and wherein the first and the second temperatures have a temperature difference smaller than about 10° C.

3. The method of claim 1, wherein the second cooling rate is greater than about 1.5° C./second.

4. The method of claim 3, wherein the second cooling rate is greater than about 1.8° C./second.

5. The method of claim 4, wherein the second cooling rate is about 2° C./second.

6. The method of claim 3, wherein the third cooling rate is lower than about 1.0° C./second.

7. The method of claim 1, wherein the plurality of solder bumps comprises about 1.8 percent Ag.

8. The method of claim 1, wherein the second cooling rate is in a range between about 1.8° C./second and about 2.4° C./second.

9. The method of claim 1, wherein the adjusting a cooling rate of the plurality of solder bumps is performed after the second time point wherein all of the plurality of solder bumps finish solidification.

* * * * *